US012451344B2

(12) United States Patent
Sumi

(10) Patent No.: US 12,451,344 B2
(45) Date of Patent: Oct. 21, 2025

(54) SUBSTRATE PROCESSING METHOD

(71) Applicant: SCREEN Holdings Co., Ltd., Kyoto (JP)

(72) Inventor: Noritake Sumi, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 57 days.

(21) Appl. No.: 18/509,055

(22) Filed: Nov. 14, 2023

(65) Prior Publication Data

US 2024/0162034 A1 May 16, 2024

(30) Foreign Application Priority Data

Nov. 16, 2022 (JP) .................................. 2022-183328

(51) Int. Cl.
*H01L 21/02* (2006.01)
*B08B 5/02* (2006.01)
*B08B 7/00* (2006.01)
*H01L 21/687* (2006.01)

(52) U.S. Cl.
CPC .......... *H01L 21/02101* (2013.01); *B08B 5/02* (2013.01); *B08B 7/0021* (2013.01); *H01L 21/68742* (2013.01)

(58) Field of Classification Search
CPC ......... H01L 21/02101; H01L 21/68742; B08B 5/02; B08B 7/0021
See application file for complete search history.

(56) References Cited

U.S. PATENT DOCUMENTS

| 2011/0220152 A1 | 9/2011 | Kitajima et al. ................. 134/26 |
| 2012/0304485 A1 | 12/2012 | Hayashi et al. ................. 34/415 |
| 2014/0144462 A1 | 5/2014 | Verhaverbeke et al. ....... 134/1.2 |
| 2018/0130675 A1* | 5/2018 | Goshi ............... H01L 21/02101 |

(Continued)

FOREIGN PATENT DOCUMENTS

| JP | 2011-192835 A | 9/2011 |
| JP | 2021-009876 A | 1/2021 |

(Continued)

OTHER PUBLICATIONS

Office Action dated Dec. 18, 2024 issued in corresponding Korean Patent Application No. 10-2023-0156507 with its English translation.

(Continued)

*Primary Examiner* — Sharidan Carrillo
(74) *Attorney, Agent, or Firm* — OSTROLENK FABER LLP

(57) ABSTRACT

A substrate processing method according to this invention includes supporting a substrate having a liquid film on an upper surface substantially in a horizontal posture by placing the substrate on a flat plate-like support tray, accommodating the support tray into an internal space of a chamber and sealing the internal space, introducing a gas which is pressurized toward a gap space between a lower surface of the support tray and a bottom surface of the internal space, and processing the substrate by a supercritical processing fluid by introducing the supercritical processing fluid into the internal space. This makes it possible to shorten a time required to remove a liquid adhering to the lower surface of a substrate being carried into a chamber.

8 Claims, 7 Drawing Sheets

(56) References Cited

U.S. PATENT DOCUMENTS

| | | | |
|---|---|---|---|
| 2018/0264504 A1* | 9/2018 | Egashira | H01L 21/02101 |
| 2020/0411336 A1 | 12/2020 | Sumi et al. | |
| 2023/0073624 A1* | 3/2023 | Shimomura | H01L 21/02057 |
| 2023/0074202 A1 | 3/2023 | Yamaguchi et al. | |
| 2024/0162034 A1* | 5/2024 | Sumi | H01L 21/67109 |
| 2024/0173753 A1* | 5/2024 | Sumi | H01L 21/304 |
| 2025/0001467 A1* | 1/2025 | Jung | H01L 21/02101 |

FOREIGN PATENT DOCUMENTS

| | | | |
|---|---|---|---|
| JP | 2021-136373 A | 9/2021 | |
| TW | 201312639 A | 3/2013 | |
| TW | 202034397 A | 9/2020 | |

OTHER PUBLICATIONS

Office Action dated May 9, 2025 issued in corresponding Taiwanese Patent Application No. 112142754.

\* cited by examiner

SUBSTRATE PROCESSING METHOD

CROSS REFERENCE TO RELATED APPLICATION

The disclosure of Japanese Patent Application No. 2022-183328 filed on Nov. 16, 2022 including specification, drawings and claims is incorporated herein by reference in its entirety.

BACKGROUND OF THE INVENTION

1. Technical Field

The present invention relates to a substrate processing technique of processing a substrate using a processing fluid in a supercritical state inside a processing container.

2. Description of the Related Art

A processing of various substrates such as semiconductor substrates and glass substrates for display device includes a processing of substrates by various processing fluids. Such a processing may be performed in an airtight processing container for the purpose of efficiently using the processing fluid and preventing scattering to outside. For example, in a processing apparatus described in JP 2021-136373A (patent literature 1), a substrate to be processed is carried into an internal space of a chamber having an opening in a side surface while being placed on a flat plate-like support tray integrated with a lid. The internal space is sealed by closing the opening by the lid. From this state, a processing fluid in a supercritical state is introduced and the substrate is processed. Since the internal space of the chamber is formed to be slightly larger than the enveloping shape of the substrate and the support tray, it is possible to reduce the use amount of the processing fluid and improve processing efficiency.

In the technique of this type, the substrate may be carried into the chamber with a liquid film on a surface of the substrate to avoid the contact of the exposed substrate before the processing with air or prevent the collapse of a fine pattern formed on the substrate surface. Also in the above conventional technique, the surface of the substrate being carried in is covered with a liquid film of an organic solvent such as IPA (isopropyl alcohol).

The liquid forming such a liquid film contributes to the surface protection of the substrate during conveyance, but should be removed in an early stage in a supercritical processing thereafter. However, if the substrate is carried in while being placed on the support tray as in the above conventional technique, it is particularly difficult to discharge the liquid having entered a minute gap between the lower surface of the substrate and the support tray. Thus, problems possibly occur such as a long time required for a processing of completely discharging the liquid and a defective processing result due to the liquid remaining a long time.

From this, it is preferable to take a measure to discharge the liquid flowed around to a lower surface side of the substrate in an early stage. However, the above conventional technique, in which such a measure was not taken, had a room for improvement on this point.

SUMMARY OF INVENTION

This invention was developed in view of the above problem and aims to provide a technique capable of shortening a time required to remove a liquid adhering to the lower surface of a substrate being carried into a chamber in a substrate processing technique for processing a substrate using a processing fluid in a supercritical state in the chamber.

One aspect of a substrate processing method according to this invention includes supporting a substrate having a liquid film on an upper surface substantially in a horizontal posture by placing the substrate on a flat plate-like support tray, accommodating the support tray into an internal space of a chamber and sealing the internal space, introducing a gas which is pressurized toward a gap space between a lower surface of the support tray and a bottom surface of the internal space, and processing the substrate by a supercritical processing fluid by introducing the supercritical processing fluid into the internal space. Here, the words "substantially in a horizontal posture" does not only mean horizontal in the strict sense, but also includes cases where the substrate is slightly tilted to the extent that the liquid film on the substrate does not break.

In the invention thus configured, the pressurized gas is introduced to the lower surface side of the support tray after the substrate having the liquid film on the upper surface is placed on the support tray and accommodated into the chamber. Immediately after the chamber is sealed, a pressure in the internal space is an atmospheric pressure and, by introducing the pressurized gas to the lower surface side of the support tray in this state, the internal space is finally filled up with the pressurized gas. In this process, a gas flow due to a pressure gradient is created from a lower side toward an upper side of the support tray. This gas flow also enters a gap between the substrate lower surface and the support tray and sweeps away the liquid adhering to the substrate lower surface. As a result, the removal of the liquid from the substrate lower surface can be promoted.

As described above, in the invention, the liquid adhering to the substrate lower surface can be swept away by first introducing the pressurized gas to the lower surface side of the support tray accommodated in the chamber together with the substrate. Thus, a time required to remove the remaining liquid in a subsequent supercritical processing can be shortened and processing failures due to the remaining liquid can be suppressed.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

DETAILED DESCRIPTION OF THE PREFERRED EMBODIMENTS

Figure 1:
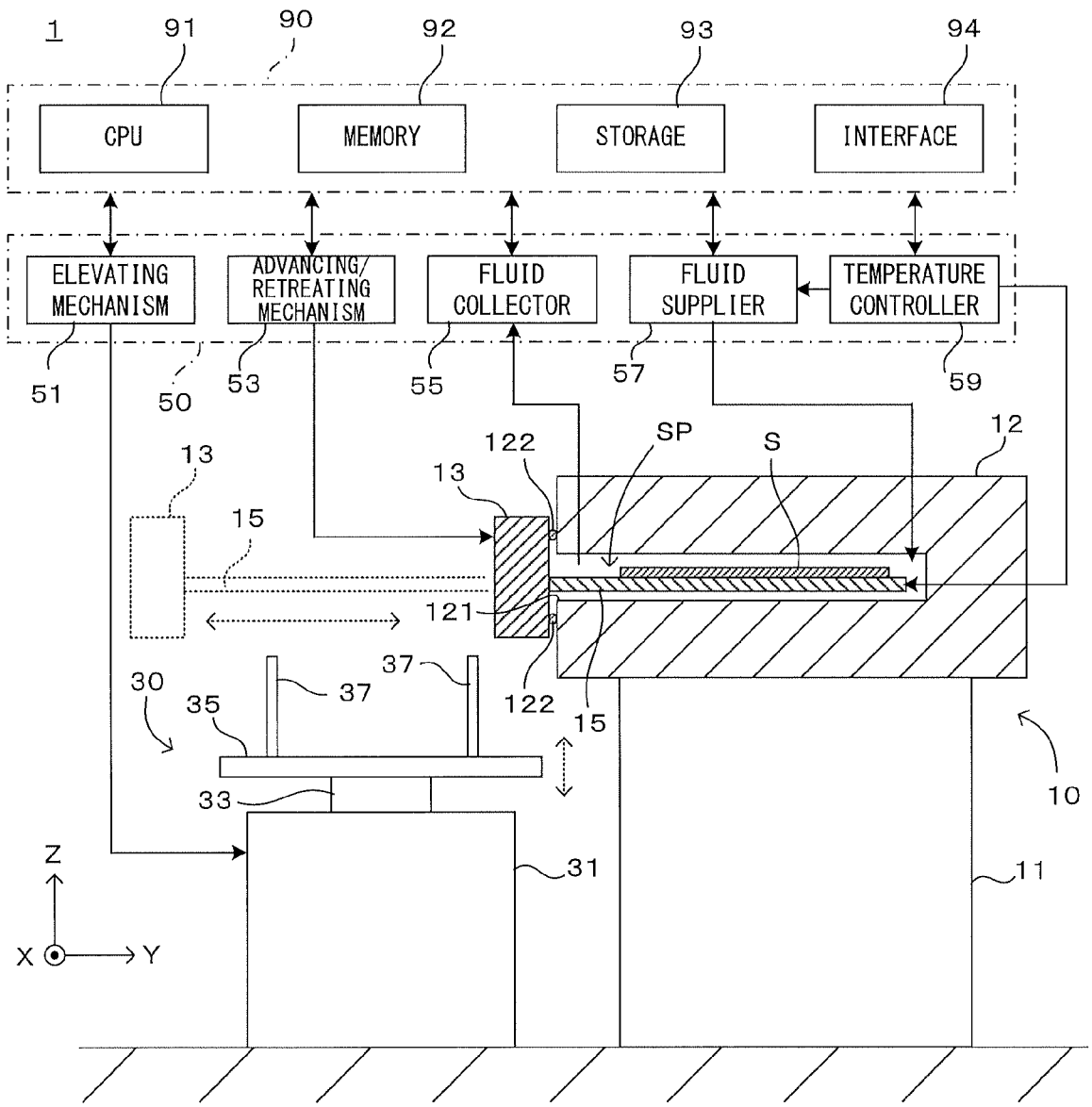
FIG. 1 is a drawing which shows a schematic configuration of one embodiment of a substrate processing apparatus according to the invention.

FIG. 1 is a drawing which shows a schematic configuration of one embodiment of a substrate processing apparatus according to the invention. This substrate processing apparatus 1 is an apparatus for processing surfaces of various substrates such as semiconductor substrates using supercritical fluids. To show directions in each figure in a unified manner below, an XYZ orthogonal coordinate system is set as shown in FIG. 1. Here, an XY plane represents a horizontal plane and a Z direction represents a vertical direction. More specifically, a (−Z) direction represents a vertically downward direction.

Various substrates such as semiconductor wafers, glass substrates for photomask, glass substrates for liquid crystal display, glass substrates for plasma display, substrates for FED (Field Emission Display), substrates for optical disk, substrates for magnetic disk, substrates for magneto-optical disk can be adopted as the "substrate" in this embodiment. A substrate processing apparatus used to process a disk-shaped semiconductor wafer is mainly described as an example with reference to the drawings, but the substrate processing apparatus can be adopted also to process various substrates illustrated above. Also as a shape of the substrate, various types are applicable.

Note that the main configuration and the basic operation of the substrate processing apparatus of the embodiment are common to those described in the patent literature 1. Thus, the configurations and the operation principles that can be understood by referring to the patent literature 1 may not be described in detail in this description.

The substrate processing apparatus 1 includes a processing unit 10, a transfer unit 30, a supply unit 50 and a control unit 90. The processing unit 10 serves as an execution subject of a supercritical drying process. The transfer unit 30 receives an unprocessed substrate S transported by an external transport apparatus not shown in the figure and carries the substrate S into the processing unit 10. Further, the transfer unit 30 delivers a processed substrate S from the processing unit 10 to the external transport apparatus. The supply unit 50 supplies chemical substances and power necessary for the process to the processing unit 10 and the transfer unit 30.

The control unit 90 realizes a predetermined process by controlling these components of the apparatus. For this purpose, the control unit 90 includes a CPU 91, a memory 92, a storage 93, an interface 94, and the like. The CPU 91 executes various control programs. The memory 92 temporarily stores processing data. The storage 93 stores the control programs to be executed by the CPU 91. The interface 94 exchanges information with a user and an external apparatus. Operations of the apparatus to be described later are realized by the CPU 91 causing each component of the apparatus to perform a predetermined operation by executing the control program written in the storage 93 in advance.

The processing unit 10 has a structure in which a processing chamber 12 is settled on a pedestal 11. The processing chamber 12 is structured by a combination of several metal blocks which form a hollow inside serving as a processing space SP. A substrate S to be processed is carried into the processing space SP to be processed. A slit-like aperture 121 elongated in an X direction is formed in a (−Y) side surface of the processing chamber 12. The processing space SP communicates with an outside space via the aperture 121.

A lid part 13 is provided on the (−Y) side surface of the processing chamber 12 to close the aperture 121. An airtight processing container is configured by closing the aperture of the processing chamber 12 by the lid part 13, whereby a processing to the substrate S under a high pressure in the internal processing space SP is allowed. A support tray 15 in the form of a flat plate is attached in a horizontal posture to a (+Y) side surface of the lid part 13. The upper surface of the support tray 15 serves as a support surface on which the substrate S can be placed. The lid part 13 is supported horizontally movably in a Y direction by an unillustrated support mechanism.

The lid part 13 is movable toward and away from the processing chamber 12 by an advancing/retreating mechanism 53 provided in the supply unit 50. Specifically, the advancing/retreating mechanism 53 includes a linear mechanism such as a linear motor, a linear guide, a ball-screw mechanism, a solenoid or an air cylinder. Such a linear mechanism moves the lid part 13 in the Y direction. The advancing/retreating mechanism 53 operates in response to a control command from the control unit 90.

By a movement of the lid part 13 in a (−Y) direction, the lid part 13 separates away from the processing chamber 12 and the support tray 15 is pulled out from the processing space SP to outside via the aperture 121 as indicated by dotted lines. By doing so, the support tray 15 is accessible from outside. Specifically, it becomes possible to place the substrate S on the support tray 15 and take out the substrate S placed on the support tray 15. On the other hand, the lid part 13 moves in a (+Y) direction, whereby the support tray 15 is accommodated into the processing space SP. If the substrate S is placed on the support tray 15, the substrate S is carried into the processing space SP together with the support tray 15.

The lid part 13 moves in the (+Y) direction to close the aperture 121, whereby the processing space SP is sealed. A sealing member 122 is provided between the (+Y) side surface of the lid part 13 and the (−Y) side surface of the processing chamber 12 and an airtight state of the processing space SP is maintained. The seal member 12 is made of rubber material, for example. Further, the lid part 13 is fixed to the processing chamber 12 by an unillustrated lock mechanism. As described above, in this embodiment, the lid part 13 is switched between a closing state (solid line) to close the aperture 121 and seal the processing space SP and a separating state (dotted line) to enable the substrate S to pass through by separating widely from the aperture 121.

The substrate S is processed in the processing space SP with the airtight state of the processing space SP ensured. In this embodiment, a fluid of a substance usable for a supercritical process, e.g. carbon dioxide, is sent from a fluid supplier 57 provided in the supply unit 50 as the processing fluid. The processing fluid is supplied to the processing unit 10 in a gaseous, liquid or supercritical state. Carbon dioxide enters a supercritical state at relatively low temperature and low pressure and is a chemical substance suitable for the supercritical drying process in having a property of dissolving an organic solvent often used in substrate processing well. At a critical point of carbon dioxide at which the fluid comes into the supercritical state, a pressure (critical pressure) is 7.38 MPa and a temperature (critical temperature) is 31.1° C.

If the processing fluid is filled into the processing space SP and the inside of the processing space SP reaches suitable temperature and pressure, the processing space SP is filled with the processing fluid in the supercritical state. In this way, the substrate S is processed by the supercritical fluid in the processing chamber 12. A fluid collector 55 is provided in the supply unit 50, and the fluid after the processing is collected by the fluid collector 55. The fluid supplier 57 and the fluid collector 55 are controlled by the control unit 90. Note that, as described later, the fluid supplier 57 has a function of supplying a pressurized inert gas such as a nitrogen gas to the processing chamber 12 beside the processing fluid such as carbon dioxide, which enters the supercritical state.

To prevent the processing fluid in a supercritical state from being cooled to be changed in phase in the processing chamber 12, a suitable heat source is preferably provided in the processing chamber SP. In particular, in the present embodiment, to prevent the occurrence of unintentional phase change around the substrate S, a built-in heater (not shown in the drawings) is provided in the support tray 15. The heater is controlled in temperature by a temperature controller 59 of the supply unit 50. The temperature controller 59 operates in response to a control command from the control unit 90 and also has the function of controlling the temperature of a processing fluid supplied from the fluid supplier 57, as described later.

The processing space SP has a shape and a capacity in which the support tray 15 and the substrate S supported on the support tray 15 are receivable. Specifically, the processing space SP has a rectangular sectional shape greater in the horizontal direction than the width of the support tray 15 and greater in the vertical direction than a height covering the support tray 15 and the substrate S, and has a depth with which the support tray 15 is receivable. In this way, the processing space SP has a shape and a capacity sufficient for receiving the support tray 15 and the substrate S. Meanwhile, only a slight gap is formed from the support tray 15 and the substrate S to an inner wall surface of the processing space SP. Thus, the processing fluid necessary for filling the processing space SP can be controlled to a relatively small amount.

The transfer unit 30 is responsible for transfer of the substrate S between the external transport device and the support tray 15. For this purpose, the transfer unit 30 includes a body 31, an up/down member 33, a base member 35, and a plurality of lift pins 37. The up/down member 33 is a columnar member extending in the Z direction and is supported movably in the Z direction by a support mechanism not shown in the drawings. The base member 35 having a substantially horizontal upper surface is attached on the up/down member 33. The lift pins 37 are provided upward in standing positions from the upper surface of the base member 35. Each of the lift pins 37 has an upper end to abut on the lower surface of the substrate S, thereby supporting the substrate S from below in a horizontal posture. To support the substrate S stably in a horizontal posture, it is desirable to provide three or more lift pins 37 having upper ends of substantially equal heights.

The up/down member 33 can be moved up and down by an elevating mechanism 51 provided to the supply unit 50. More specifically, the elevating mechanism 51 includes a linear-motion mechanism such as a liner motor, a linear-motion guide, a ball screw mechanism, a solenoid, or an air cylinder, for example, and such a linear-motion mechanism moves the up/down member 33 in the Z direction. The elevating mechanism 51 operates in response to a control command from the control unit 90.

The up/down movement of the up/down member 33 moves the base member 35 up and down, and moves the lift pins 37 integrally with the base member 35. By doing so, the substrate S is transferred between the transfer unit 30 and the support tray 15.

Figure 2:
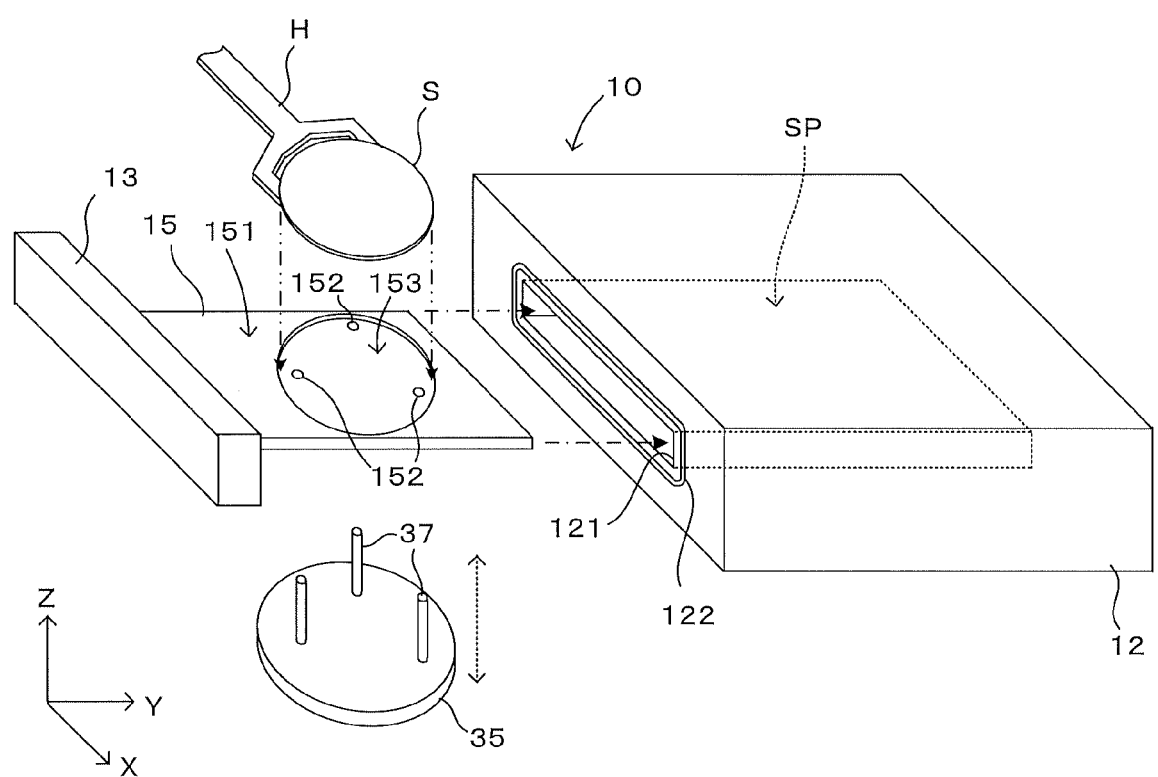
FIG. 2 is a perspective view showing a principal part of the processing unit.

FIG. 2 is a perspective view showing a principal part of the processing unit. When the lid part 13 is in a separated state where the lid part 13 is moved in the (−Y) direction, the support tray 15 is in a state of being pulled out to outer space from the processing chamber 12. The base member 35 with the lift pin 37 is arranged under the support tray 15 in this state. A through hole 152 of a larger diameter than the diameter of the lift pin 37 is formed at the support tray 15 at a position directly above the lift pin 37.

When the base member 35 moves up, the upper end of the lift pin 37 is passed through the through hole 152 to reach a position higher than a support surface 151 of the support tray 15. In this state, the substrate S being supported and transported on a hand H of the external transport device is transferred to the lift pin 37. After the hand H retreats, the lift pin 37 moves down to transfer the substrate S from the lift pin 37 to the support tray 15. The substrate S can be ejected through a procedure reverse to that described above.

A recess 153 having a slightly larger size than a plane size of the substrate S is provided in the upper surface of the support tray 15. The substrate S transferred from the lift pins 37 to the support tray 15 is restricted from being displaced in a horizontal direction on the support tray 15 by being accommodated into this recess 153. The through holes 152 for allowing the insertion of the lift pins 37 are provided inside the recess 153 due to a positional relationship that the lift pins 37 support and raise the lower surface of the substrate S and accommodate the substrate S into the recess 153.

Figure 3:
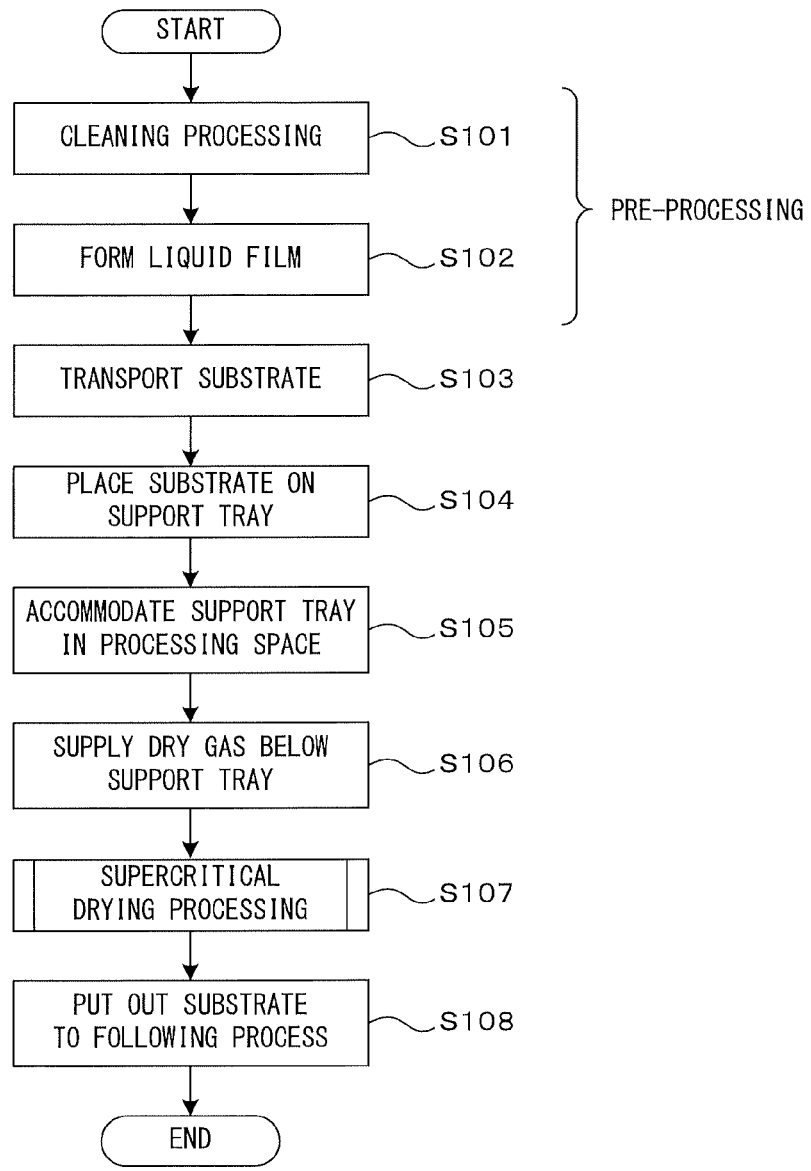
FIG. 3 is a flowchart showing part of the process performed by a substrate processing system including the above-described substrate processing apparatus.

FIG. 3 is a flowchart showing part of the process performed by a substrate processing system including the above-described substrate processing apparatus. The substrate processing apparatus 1 is used to dry the substrate S after being cleaned with a cleaning liquid in a previous processing. This process is described in detail next. After cleaning with a cleaning liquid in a pre-processing (step S101), while the substrate S is given a liquid film made of isopropyl alcohol (IPA) formed on its surface (step S102), the substrate S is transported to the substrate processing apparatus 1 (step S103).

For example, a fine pattern formed on a surface of the substrate S causes a risk of collapse of the pattern due to the surface tension of a remaining liquid adhering to the substrate S. In another case, a watermark may remain on the surface of the substrate S due to insufficient drying. In another case, alteration such as oxidation may be caused if the surface of the substrate S contacts outside air. To prevent these problems before they occur, the substrate S may be transported while the surface (pattern forming surface) of the substrate S is covered with a liquid or solid surface layer.

If the cleaning liquid is mainly composed of water, for example, the substrate W is transported while the substrate S is given a liquid film formed using a liquid lower in surface tension and less corrosive to a substrate than water that may be an organic solvent such as IPA or acetone, for example. Specifically, the substrate S is transported to the substrate processing apparatus 1 while being supported in a horizontal state and given the liquid film formed on its upper surface.

The substrate S is placed on the support tray 15 while the pattern forming surface is positioned as an upper surface and the upper surface is covered with the thin liquid film (step S104). When the support tray 15 and the lid part 13 move integrally in a (+Y) direction, the support tray 15 supporting the substrate S is housed in the processing space SP in the processing chamber 12 and the aperture 121 is closed by the lid part 13 (step S105).

In the sealed processing space SP, into which the substrate S is carried together with the support tray 15, a dry gas is first supplied toward a space below the support tray 15 (Step S106). This is a processing for removing the liquid adhering to the lower surface side of the substrate S from the substrate S by sweeping away the liquid by a gas flow.

The liquid adhering to the lower surface of the substrate S during carry-in or the liquid flowed around from the upper surface after carry-in may enter between the lower surface of the substrate S and the upper surface of the support tray 15, more specifically the upper surface of the recess 153 accommodating the substrate S. The liquid forming the liquid film is replaced by a supercritical processing fluid to be introduced later, but it takes a long time to replace the liquid having entered such a minute gap, whereby the use amount of the processing fluid increases. Further, the liquid remaining without being replaced causes processing failures such as the re-adhesion of contaminants to the substrate S.

To avoid this problem, in this embodiment, the liquid having entered the gap between the lower surface of the substrate S and the upper surface of the support tray 15 is pushed to outside by introducing the pressurized dry gas such as a nitrogen gas from a side below the support tray 15. Here, it is not required to discharge the liquid to the outside of the chamber. This processing is described in detail later.

After the supply of the dry gas, the supercritical drying processing is performed (Step S107). Then, the processed substrate S is put out to the following process (Step S108). That is, the lid member 13 moves in the (−Y) direction, whereby the support tray 15 is pulled out to outside from the processing chamber 12 and the substrate S is transferred to an external conveyor device via the transfer unit 30. At this time, the substrate S is in a dry state. Contents of the following process are arbitrary.

Figure 4:
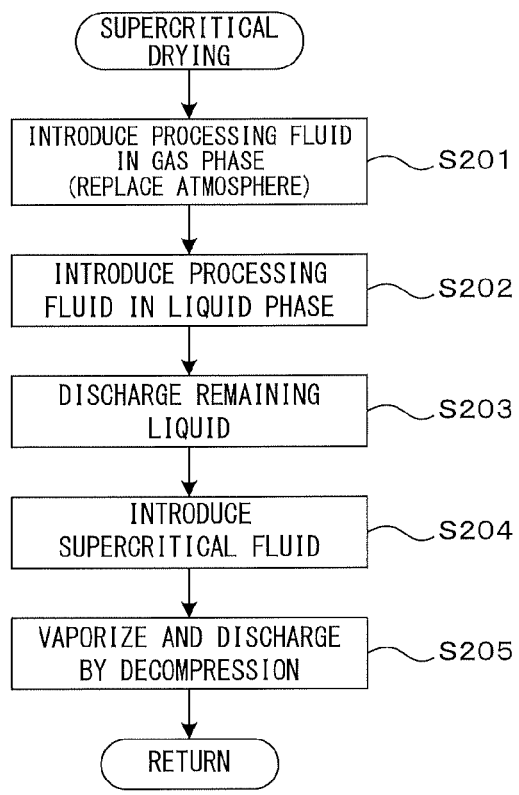
FIG. 4 is a flow chart showing steps of the supercritical drying processing.

FIG. 4 is a flow chart showing steps of the supercritical drying processing. Although a case example, in which carbon dioxide ($CO_2$) is used as the processing fluid, is described below, the type of the processing fluid is not limited to this. After the substrate S having a paddle-like liquid film LP (FIG. 5) formed thereon is carried into the processing chamber 12 from outside and the dry gas is supplied, the processing fluid in a gas phase state is introduced into the processing space SP (Step S201). By feeding the gas-phase processing fluid while exhausting the inside of the processing space SP, an atmosphere in the processing space SP is replaced by the processing fluid.

Subsequently, the processing fluid in a liquid phase state is introduced into the processing space SP (Step S202). Carbon dioxide in a liquid state dissolves the liquid (organic solvent; e.g. IPA) constituting the liquid film LP on the substrate S well, and isolates the liquid from the upper surface of the substrate S. By discharging the liquid in the processing space SP, the IPA remaining on the substrate S can be discharged (Step S203).

Next, the processing fluid in the supercritical state is introduced into the processing space SP (Step S204). The processing fluid brought into the supercritical state in advance outside the processing chamber 12 may be introduced or the processing fluid may be brought into the supercritical state by setting a temperature and a pressure in the processing chamber 12 filled with the processing fluid in the liquid state to those at a critical point or higher.

Thereafter, the supercritical fluid is vaporized and discharged without via a liquid phase by decompressing the inside of the processing chamber 12 while maintaining the temperature (Step S205). In this way, the substrate S enters the dry state. Since the pattern forming surface of the substrate S is not exposed to an interface between the liquid phase and the gas phase during this time, the occurrence of pattern collapse due to a surface tension of the liquid is prevented. Further, since the supercritical fluid has a very low surface tension, even if a fine pattern is formed on a surface of the substrate, the processing fluid enters well into the inside of the pattern. Thus, the liquid and the like remaining inside the pattern can be efficiently replaced. In this way, the substrate S is satisfactorily dried.

As described above, in this embodiment, liquid components remaining on the substrate S are removed and the substrate S is dried by filling the processing space SP in the processing chamber 12 accommodating the substrate S with the supercritical fluid. Thus, if the supercritical fluid contacting the substrate S includes impurities, the impurities remain on and adhere to the dried substrate S and contaminate the substrate S.

Such contamination sources include remnants of the liquid adhered to the substrate S during carry-in, impurities brought into the processing space SP from outside and the like. Particularly, impurities arriving from an outside space when the substrate S is carried in and out and impurities generated from members such as the sealing member 122 may be mixed into the processing fluid near the opening 121 of the processing chamber 12. A measure taken in this embodiment to prevent the contamination of the substrate S by impurities during the supercritical drying processing is described below.

Figure 5:
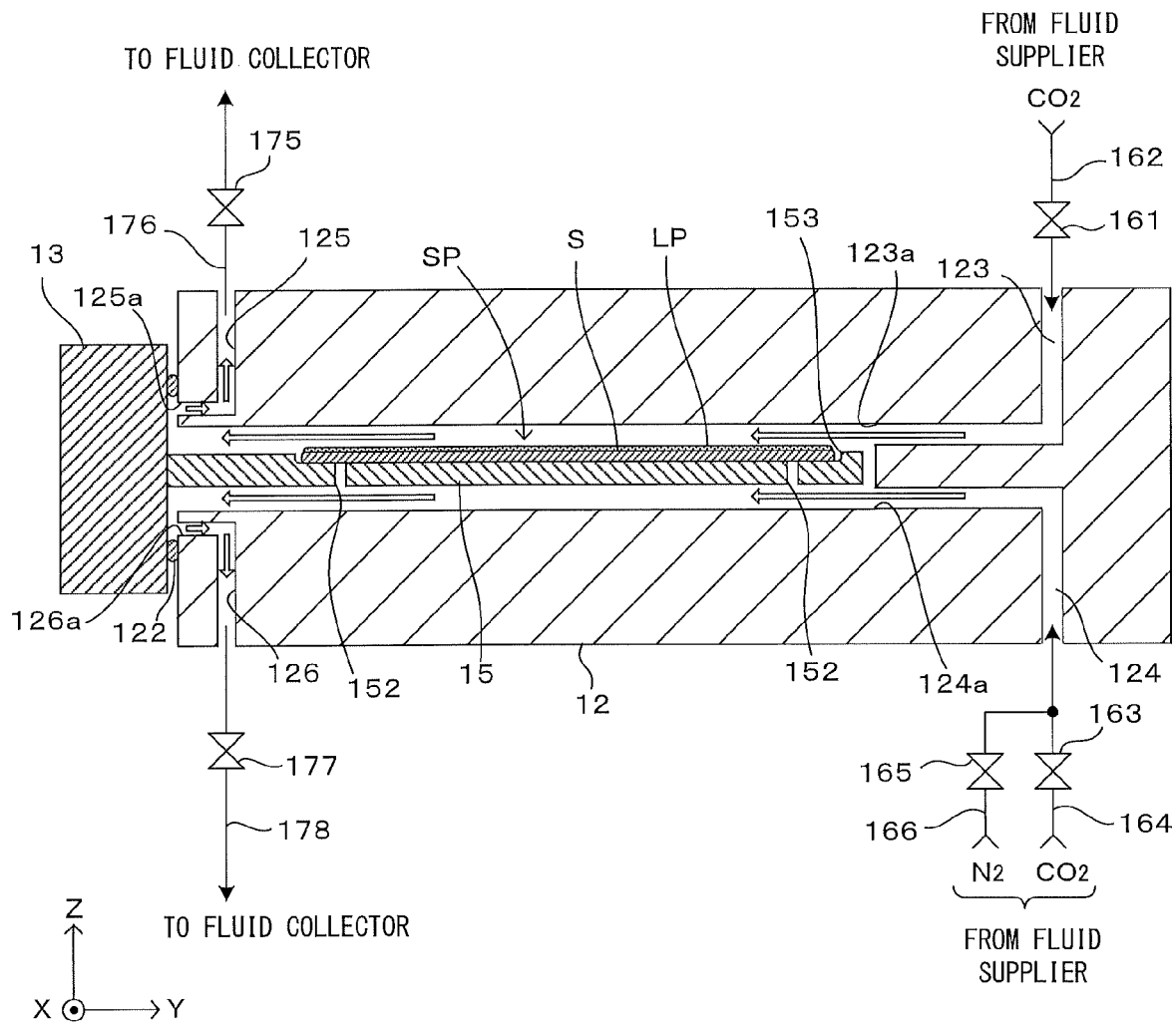
FIG. 5 schematically shows a flow of the processing fluid in the processing space.

FIG. 5 schematically shows a flow of the processing fluid in the processing space. As shown in FIG. 5, the fluid supplier 57 that supplies the processing fluid is connected to an introduction flow passage 123 and an introduction flow passage 124 provided on the (+Y) side of the processing space SP, namely, on the opposite side of the aperture 121 as viewed from the processing space SP. More specifically, the first introduction flow passage 123 and the second introduction flow passage 124 are formed at the processing chamber 112 external to an end of the substrate S on the (+Y) side housed in the processing space SP, namely, closer to the (+Y) side than this end.

The first introduction flow passage 123 is connected to the fluid supplier 57 by a pipe 162 including a valve 161. Opening the valve 161 causes the processing fluid ($CO_2$) from the fluid supplier 57 to flow into the first introduction flow passage 123. While the fluid is set to finally flow in the horizontal direction ((−Y) direction), the processing fluid is ejected from the first introduction flow passage 123 through a first introduction port 123a formed in such a manner as to face the processing space SP at an end of the processing space SP on the (+Y) side.

On the other hand, the second introduction flow passage 124 is connected to the fluid supplier 57 by a pipe 164 including a valve 163 and a pipe 166 including a valve 165. The processing fluid ($CO_2$) supplied from the fluid supplier 57 flows in the pipe 164, and the valve 163 is in charge of opening and closing the flow passage and adjusting a flow rate. On the other hand, the nitrogen gas supplied from the fluid supplier 57 flows in the pipe 166, and the valve 165 is in charge of opening and closing the flow passage and adjusting a flow rate. The pipes 164, 166 respectively join at an output side of the valves 163, 165 and are connected to the second introduction flow passage 124. Therefore, the processing fluid can be supplied via the pipe 164 and the nitrogen gas can be supplied via the pipe 166 to the second introduction flow passage 124.

By opening the valve 163, the processing fluid from the fluid supplier 57 flows into the second introduction flow passage 124. Further, by opening the valve 165, the nitrogen gas flows into the second introduction flow passage 124 from the fluid supplier 57. The second introduction flow passage 124 finally makes a flowing direction of the fluid a horizontal direction ((−Y) direction) and discharges these fluids from a second introduction port 124*a* open to face the processing space SP at an end part on the (+Y) side of the processing space SP.

The first introduction port 123*a* is formed in such a manner as to face an upper space of the processing space SP over the substrate S held in the processing space SP. Meanwhile, the second introduction port 124*a* is formed in such a manner as to face a lower space of the processing space SP under the substrate S held in the processing space SP, in a more precise sense, under the support tray 15 supporting the substrate S. Each of the first introduction port 123*a* and the second introduction port 124*a* is an aperture like a slit with a constant opening width extending in an elongated shape in the X direction. Each of the first introduction port 123*a* and the second introduction port 124*a* extends more externally than an end of the substrate S as viewed in the X direction. Thus, the processing fluid ejected from each of the first introduction port 123*a* and the second introduction port 124*a* is introduced into the processing space SP as a flow toward the (−Y) direction in the form of a thin layer having a small thickness in a top-bottom direction (Z direction) and having a greater width in the X direction than the substrate S. As long as the processing fluid finally ejected from each of the first introduction port 123*a* and the second introduction port 124*a* is in a direction that is substantially the horizontal direction, the shapes of the intermediate flow passages are not limited to those illustrated in the drawings.

In terms of the purpose of the process of filling the periphery of the substrate S with the supercritical fluid, the option of not discharging the processing fluid until the processing space SP is filled with the supercritical fluid is applicable. However, such an option might cause a situation where the processing fluid stays in the processing space SP, and impurity existing in the processing space SP adheres to the substrate S to contaminate the substrate S. To prevent this, the processing fluid is desirably discharged even in a supercritical state to always supply the substrate S with a clean processing fluid.

To achieve this, a first discharge flow passage 125 and a second discharge flow passage 126 for discharge of the processing fluid are provided in the vicinity of an end of the processing space SP on the (−Y) side. More specifically, a first discharge port 125*a* is formed at a ceiling surface of the processing space SP closer to the (−Y) side than the substrate S housed in the processing space SP. The first discharge flow passage 125 communicating with the first discharge port 125*a* is connected to the fluid collector 55 through a pipe 176 with a valve 175. Opening the valve 175 causes the processing fluid in the processing space SP to discharge to the fluid collector 55 through the first discharge flow passage 125.

Meanwhile, a second discharge port 126*a* is formed at a bottom surface of the processing space SP still closer to the (−Y) side than an end of the substrate S on the (−Y) side housed in the processing space SP. The second discharge flow passage 126 communicating with the second discharge port 126*a* is connected to the fluid collector 55 through a pipe 178 with a valve 177. Opening the valve 177 causes the processing fluid in the processing space SP to discharge to the fluid collector 55 through the second discharge flow passage 126.

Each of the first discharge port 125*a* and the second discharge port 126*a* is an aperture like a slit with a constant opening width extending in an elongated shape in the X direction. These openings extend more externally than the end of the substrate S as viewed in the X direction. These are formed closer to the (−Y) side than the end of the substrate S on the (−Y) side as viewed in the Y direction. The processing space SP is practically divided in the top-bottom direction by the support tray 15 in the vicinity of the locations of these openings. Thus, while the processing fluid flowing over the substrate S is discharged from the first discharge port 125*a*, the processing fluid flowing under the substrate S is discharged from the second discharge port 126*a*.

Degrees of opening of the valves 161 and 175 are adjusted in such a manner as to provide equality between the flow rate of the processing fluid to be supplied to the first introduction flow passage 123 and the flow rate of the processing fluid to be discharged from the first discharge flow passage 125. Likewise, degrees of opening of the valves 163 and 177 are adjusted in such a manner as to provide equality between the flow rate of the processing fluid to be supplied to the second introduction flow passage 124 and the flow rate of the processing fluid to be discharged from the second discharge flow passage 126.

With these configurations, the processing fluid introduced from the fluid supplier 57 through the first introduction flow passage 123 is ejected from the first introduction port 123*a* in a substantially horizontal direction, flows along the upper surface of the substrate S, and is finally discharged from the first discharge port 125*a* to the outside and collected by the fluid collector 55. Meanwhile, the processing fluid introduced from the fluid supplier 57 through the second introduction flow passage 124 is ejected from the second introduction port 124*a* in a substantially horizontal direction, flows along the lower surface of the support tray 15, and is finally discharged from the second discharge port 126*a* to the outside and collected by the fluid collector 55. Specifically, in the processing space SP, laminar flows of the processing fluid toward the (−Y) direction are expected to be formed both over the substrate S and under the support tray 15. Blank arrows shown in FIG. 5 schematically indicate such flows of the processing fluid.

As described above, forming a laminar flow of the processing fluid toward one direction in the processing space SP, particularly in space over the substrate S makes it possible to prevent the occurrence of a turbulent flow around the substrate S. Thus, even if the liquid adheres to a surface of the substrate S, the liquid dissolves in the processing fluid in a supercritical state and carried downstream, thereby preventing the liquid from remaining on the dried substrate S. Furthermore, a direction of passage of the processing fluid is determined in such a manner that the aperture 121 where impurity to become a source of contamination is likely to arise is arranged downstream from the substrate S. This prevents impurity arising around the aperture 121 from being carried upstream by a turbulent flow and from adhering to the substrate. As a result, it becomes possible to dry the substrate S favorably without causing contamination.

Next, the dry gas supply processing (Step S106 of FIG. 3) performed in this embodiment is described. As described above, this processing is for sweeping away the liquid having entering the gap between the substrate S and the support tray 15 prior to the supercritical processing after the substrate S is accommodated into the processing space SP.

Figure 6:
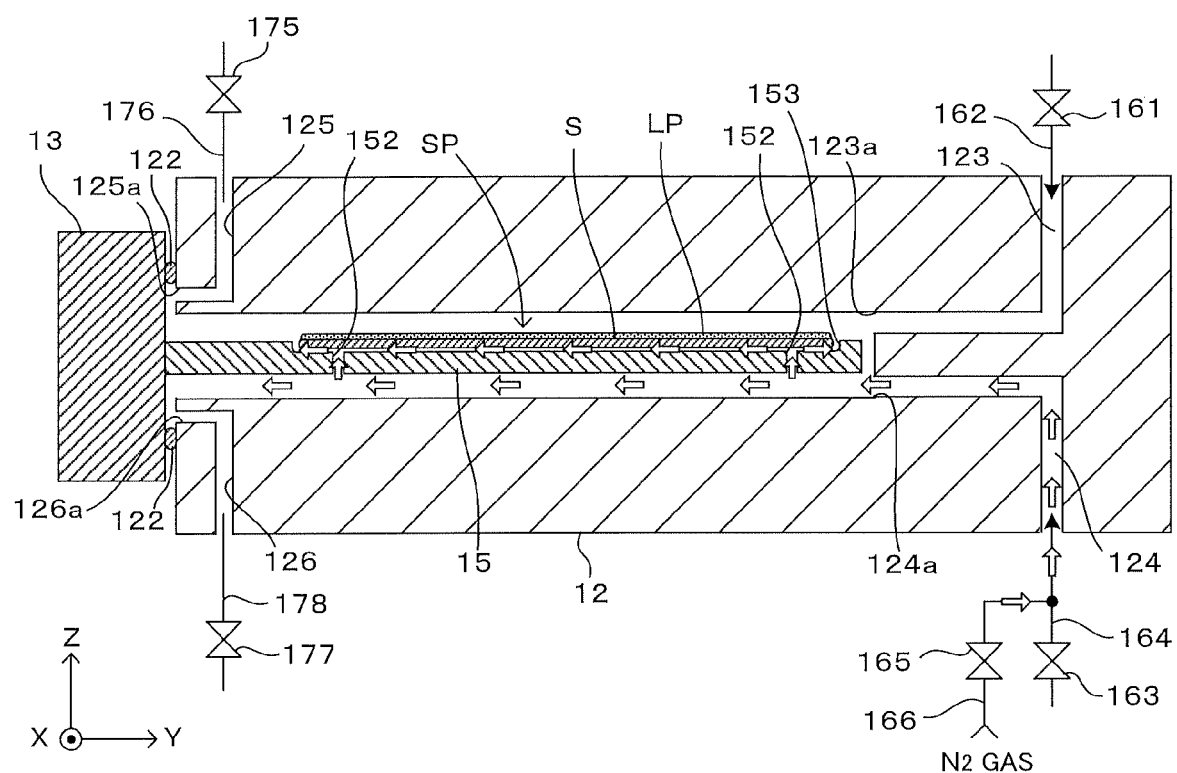
FIG. 6 is a diagram schematically showing gas flows in the chamber in the dry gas supply processing.

FIG. 6 is a diagram schematically showing gas flows in the chamber in the dry gas supply processing. When the support tray 15 having the substrate S placed thereon is accommodated into the processing space SP and the lid member 13 closes the opening 121, each valve 161, 163, 165, 175, 177 is closed and the pressure in the processing space SP is an atmospheric pressure. From this state, the valve 165 is opened. Then, the pressurized nitrogen gas ($N_2$ gas) supplied from the fluid supplier 57 is introduced into the processing space SP through the second introduction port 124a via the second introduction flow passage 124. A pressure of the nitrogen gas at this time can be set at a value significantly higher than the atmospheric pressure and significantly lower than the critical pressure of the processing fluid, e.g. about 0.1 MPa.

In FIG. 6, white arrows schematically show flows of the nitrogen gas introduced into the processing space SP. The pressurized nitrogen gas is discharged substantially in a horizontal direction toward a space between the lower surface of the support tray 15 and the bottom surface of the processing space SP from the second introduction port 124a. In this way, the pressure suddenly increases below the support tray 15. On the other hand, the pressure increases more gently above the support tray 15. Therefore, a pressure difference is generated between the spaces above and below the support tray 15 and, due to this, a gas flow from the space below the support tray 15 toward the space above the support tray 15 is created.

Since the processing space SP is substantially divided in the vertical direction by the support tray 15, a large pressure difference is generated in the short term and a gas flow with a fast flow velocity is created. Such a gas flow moves toward the space above the support tray 15, for example, through small gaps between the side surfaces of the support tray 15 and the side wall surfaces of the processing space SP. A part of the gas flow also enters the gap between the substrate S and the support tray 15 via the through holes 152 provided in the support tray 15. At this time, the liquid adhering to the lower surface of the substrate S is swept away by the gas flow and pushed out from the gap between the substrate S and the support tray 15. On the other hand, above the support tray 15, there is no such large pressure difference in the horizontal direction as to create a strong gas flow. Thus, there is a little influence on the liquid film LP covering the upper surface of the substrate S.

The liquid pushed out from the gap between the substrate S and the support tray 15 is discharged to outside from the processing space SP by the introduction of the processing fluid in the subsequent supercritical drying processing. In the dry gas supply processing, by pushing out even some of the liquid having entered the narrow gap between the substrate S and the support tray 15 to outside, an effect of shortening a time required to discharge the liquid in the supercritical drying processing can be achieved. Thus, the liquid needs not be completely removed in the dry gas supply processing.

When the dry gas is filled into the processing space SP and the pressure of the processing space SP becomes substantially equal to the pressure of the introduced dry gas, the valve 165 is closed and the supply of the dry gas is stopped. By subsequently opening the valves 161, 163, the supply of the processing fluid in the gas phase to the processing space SP is started. That is, the supercritical drying processing is started.

The nitrogen gas serving as the dry gas may have a normal temperature, but may be heated to a temperature substantially equal to that of the processing fluid to be introduced later. This is not, for example, for the purpose of promoting the volatilization of the liquid, but for the purpose of maintaining the temperature in the processing space SP. Further, the type of the dry gas is not limited to the nitrogen gas, but various types of chemical substances can be used. To avoid an influence on the substrate S, the dry gas is desirably a gas not containing oxygen and moisture. Since a high-purity gas not containing these is available and relatively low in cost, the nitrogen gas is suitable for such a use.

Further, carbon dioxide serving the processing fluid can also be used as the dry gas. In the case of using the same type of gas as the processing fluid as the dry gas, there is a difference from the processing of the conventional technique in that a period for discharging the pressurized processing fluid only toward the space below the support tray 15 after the support tray 15 is accommodated is provided. That is, after the support tray 15 is accommodated into the processing space SP, a state where the valve 161 is closed and the valve 163 is opened is continued for a certain period.

In this way, the processing fluid in the gas phase is introduced to the space below the support tray 15 and the gas flow due to a pressure difference acts to push out the liquid in the gap between the substrate S and the support tray 15. In contrast, in the case of supplying the processing fluid to the both spaces above and below the support tray 15 from the start, the aforementioned gas flow due to the pressure difference is not created, wherefore the action of pushing out the liquid on the lower surface side of the substrate S becomes smaller.

The following describes a more specific system configuration for fulfilling such conditions by using some examples. The description given above is intended for explanation of the principles, so that connection from each of the first introduction flow passage 123 and the second introduction flow passage 124 to the fluid supplier 57 is described as being formed through a single valve and a single pipe. Actually, as shown in the examples given below, a more complicated route is prepared for supplying the processing fluid to introduce the processing fluid in a required state into the processing space SP as need arises.

Figure 7:
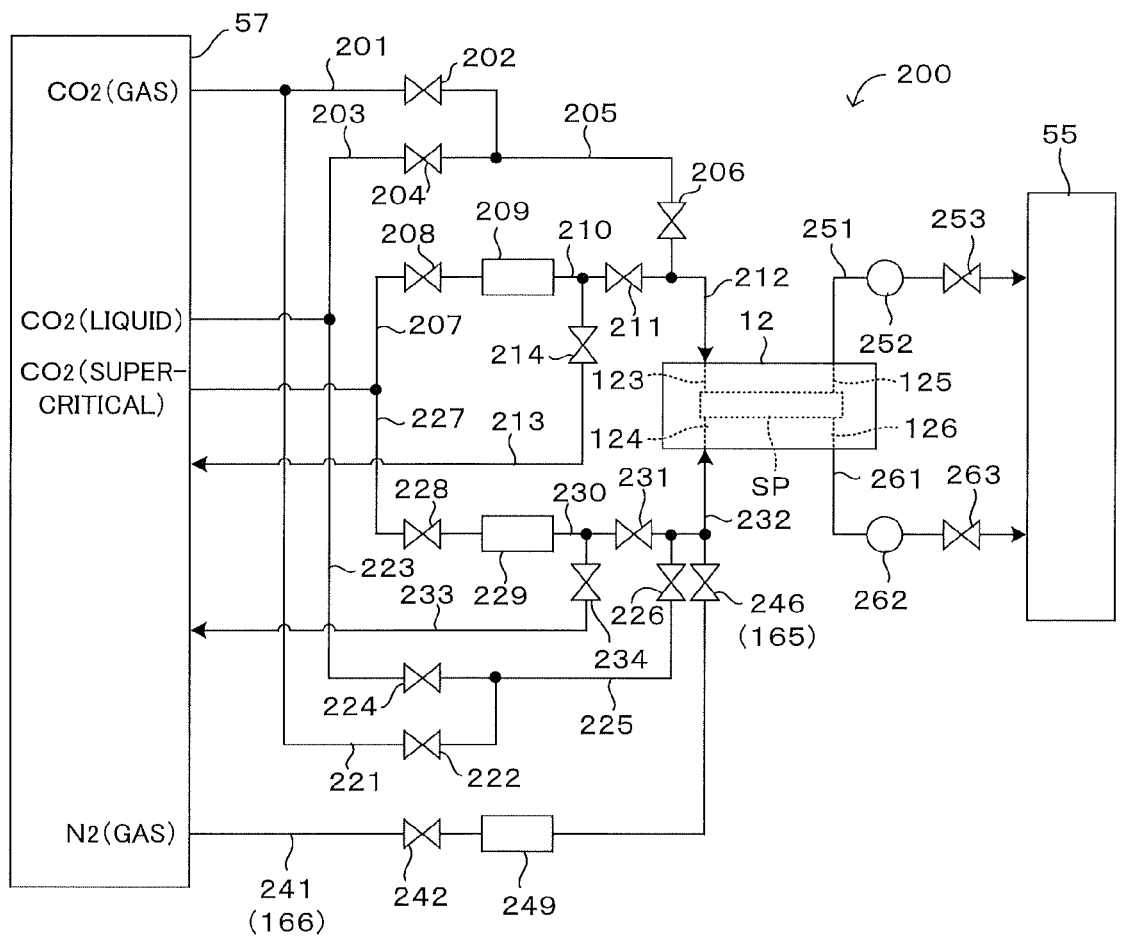
FIG. 7 is a drawing which shows an example of a passage route for the processing fluid.

FIG. 7 is a drawing which shows an example of a passage route for the processing fluid. In the following description, a reference sign 200 is given to a piping system as a whole provided as a fluid passage route between the fluid supplier 57 and the processing chamber 12 and between the processing chamber 12 and the fluid collector 55. In this example, the fluid supplier 57 has the function of supplying carbon dioxide ($CO_2$) as the processing fluid in the state of each of a gas phase, a liquid phase, and a supercritical state and the function of supplying the nitrogen gas ($N_2$) as the dry gas.

Output of gaseous $CO_2$ branches into two pipes 201 and 221. A valve 202 is interposed in the pipe 201 as one of these pipes. A valve 222 is interposed in the other pipe 221. Likewise, output of liquid $CO_2$ branches into two pipes 203 and 223. A valve 204 is interposed in the pipe 203 as one of these pipes. A valve 224 is interposed in the other pipe 223.

Output of supercritical $CO_2$ branches into two pipes 207 and 227. A valve 208 is interposed in the pipe 207 as one of these pipes. A heater 209 is provided to the output side of the valve 208. A valve 211 is interposed in a pipe 210 connected to the output side of the heater 209. Likewise, a valve 228 is interposed in the other pipe 227 and a heater 229 is provided to the output side of the valve 228. A valve 231 is interposed in a pipe 230 connected to the output side of the heater 229.

The pipes 201 and 203 merge on the output sides of the valves 202 and 204 respectively into a pipe 205. A valve 206 is interposed in the pipe 205. The pipes 205 and 210 merge on the output sides of the valves 206 and 211 respectively into a pipe 212, and the pipe 212 is connected to the first introduction flow passage 123 of the processing chamber 12. Likewise, the pipes 221 and 223 merge on the output sides of the valves 222 and 224 respectively into a pipe 225. A valve 226 is interposed in the pipe 225. The pipes 225 and 230 merge on the output sides of the valves 226 and 231 respectively into a pipe 232, and the pipe 232 is connected to the second introduction flow passage 124 of the processing chamber 12.

In FIG. 7 and its subsequent drawings, priority is given to showing a flow of the processing fluid clearly. For this reason, the locations of the first introduction flow passage 123, the second introduction flow passage 124, the first discharge flow passage 125, and the second discharge flow passage 126 are different from those shown in FIG. 5. More specifically, the position of the introduction flow passage and that of the discharge flow passage relative to each other are reversed between FIGS. 7 and 5 in terms of right and left.

A pipe 213 branches from the pipe 210 on the output side of the heater 209 and a valve 214 is interposed in the pipe 213. Likewise, a pipe 233 branches from the pipe 230 on the output side of the heater 229 and a valve 234 is interposed in the pipe 233. The pipes 213 and 233 are provided as a circulation route for causing a supercritical fluid along the pipes to flow back to the fluid supplier 57.

A pipe 251 is connected to the first discharge flow passage 125 of the processing chamber 12. A temperature sensor 252 and a valve 253 are interposed in the pipe 251. The output side of the valve 253 is connected to the fluid collector 55. Likewise, a pipe 261 is connected to the second discharge flow passage 126. A temperature sensor 262 for detecting the temperature of the fluid and a valve 263 are interposed in the pipe 261. The output side of the valve 263 is connected to the fluid collector 55.

A nitrogen gas output of the fluid supplier 57 is connected to the second introduction port 124a of the processing chamber 12 via a pipe 241. More specifically, a valve 242, a heater 249 and a valve 246 are disposed in this order along a flowing direction of the nitrogen gas in the pipe 241. The pipe 241 joins the pipe 232 at an end thereof.

The above-described valves operate in response to control commands from the control unit 90 to open and close the pipes and to make flow rate adjustment. In particular, during supply of the supercritical fluid into the processing space SP, a degree of opening of each of the valves on the passage route is adjusted in such a manner as to provide equality between the flow rate of the processing fluid to be supplied to the first introduction flow passage 123 and the flow rate of the processing fluid to be discharged from the first discharge flow passage 125 of the processing chamber 12, and to provide equality between the flow rate of the processing fluid to be supplied to the second introduction flow passage 124 and the flow rate of the processing fluid to be discharged from the second discharge flow passage 126 of the processing chamber 12.

It is not preferable that a ratio between the amount of the processing fluid to be supplied to the first introduction flow passage 123 and the amount of the processing fluid to be supplied to the second introduction flow passage 124 is too large or too small. The reason for this is that such cases might cause a phenomenon that the processing fluid traveling under the substrate S flows upward over the substrate S or conversely, the processing fluid traveling over the substrate S overflows downward. The flow rate of the processing fluid to be supplied to the first introduction flow passage 123 and the flow rate of the processing fluid to be supplied to the second introduction flow passage 124 is desirably set in a range from 1:5 to 5:1 according to a ratio between the respective sectional areas of the passages over the substrate and under the substrate.

The heaters 209 and 229 are controlled by the temperature controller 59 of the supply unit 50 and make adjustment to a target temperature by heating the passed fluid. For this purpose, the heaters 209 and 229 are provided with temperature sensors (not shown in the drawings) for detecting the temperature of the fluid. Outputs from these temperature sensors and those of the temperature sensors 252 and 262 are given to the temperature controller 59. On the basis of the given outputs, the temperature controller 59 controls electric conductions at the heaters 209 and 229.

In terms of connection with the supercritical drying process shown in FIG. 4, in step S201 of supplying the processing fluid in a gas phase, the valves 202, 206, 222, and 226 along the route from gas output from the fluid supplier 57 to the processing chamber 12 are opened. By doing so, gaseous carbon dioxide ($CO_2$) is supplied as the processing fluid into the processing space SP. On the other hand, in step S202 of supplying the processing fluid in a liquid phase, the valves 204, 206, 224, and 226 along the route from liquid output from the fluid supplier 57 to the processing chamber 12 are opened. By doing so, liquid carbon dioxide ($CO_2$) is supplied as the processing fluid into the processing space SP.

In step S204 of supplying the supercritical fluid as the processing fluid, the valves 208, 211, 228, and 231 along the route from supercritical output from the fluid supplier 57 to the processing chamber 12 are opened. By doing so, the supercritical fluid output through the heater 209 is supplied to the first introduction flow passage 123 of the processing chamber 12, and the supercritical fluid output through the heater 229 is supplied to the second introduction flow passage 124 of the processing chamber 12.

The valves 253 and 263 are opened at appropriate times in response to control commands from the control unit 90. By doing so, the amount of discharge of the processing fluid from the processing space SP is adjusted. Causing the valves to operate in cooperation with each other in response to the progress of the supercritical drying process in this way allows the processing fluid to be supplied into the processing chamber 12 and allows the processing fluid to be discharged from the processing chamber 12 in a manner responsive to the process.

Further, in the dry gas supply processing shown in Step S106 of FIG. 3, the valve 242 is opened, whereby the pressurized nitrogen gas output from the fluid supplier 57 is supplied to the heater 249 and heated to a predetermined temperature. Then, by opening the valve 246, the heated nitrogen gas is supplied to the processing space SP via the second introduction flow passage 124. In this sense, the pipe 241 and the valve 246 can be said to be respectively in one-to-one correspondence with the pipe 166 of FIG. 5 and the valve 165 of FIG. 5.

Regarding the processing fluid in a supercritical state, the temperature or pressure of this processing fluid changes as a result of stay thereof or pressure loss occurring in the pipe. Hence, the processing fluid supplied into the processing space SP may be in a state differing from an intended state. For example, even if the temperature of the processing fluid at the output from the heater 209 or 229 conforms to the target temperature, the processing fluid may be cooled in the pipe to reduce the temperature thereof from its intended temperature when it is introduced into the processing space SP.

The following means are applicable to solve this problem, for example. A first method is to always circulate outputs from the heaters 209 and 229. More specifically, in the absence of feed of the supercritical fluid into the processing chamber 12, specifically, when the valves 211 and 231 are closed, the valves 214 and 234 are opened to form the circulation route for the supercritical fluid through the pipes 213 and 233. By doing so, the supercritical fluid controlled at the target temperature is caused to always circulate through the circulation route. As a result, a temperature in the pipe is not reduced when supply is unnecessary while the processing fluid at a predetermined temperature can be supplied readily in response to need.

A second method is to use result of temperature detection on the discharge side. Specifically, the temperature of the processing fluid flowing over the substrate S in the processing space SP can be detected by causing the temperature sensor 252 to detect the temperature of the processing fluid discharged from the first discharge flow passage 125 through the pipe 251. Also, the temperature of the processing fluid flowing under the support tray 15 in the processing space SP can be detected by causing the temperature sensor 262 to detect the temperature of the processing fluid discharged from the second discharge flow passage 126 through the pipe 261. These results of the temperature detection are fed back to the temperature control at the heaters 209 and 229 to allow the temperatures of the processing fluid flowing in the processing space SP to approximate to the intended target temperatures.

This method also works effectively if a factor for changing the temperature of the processing fluid is present inside the processing space SP. For example, if the temperature of the warmed support tray 15 is higher than the temperature of the processing fluid supplied under the support tray 15, an upward flow might be developed in the processing space SP as a result of warming of the processing fluid. The temperature sensor provided along the discharge route is available for detection of such temperature change. Thus, by feeding result of the detection back to the heater control, the occurrence of a turbulent flow can be prevented.

Note that an apparatus configuration of FIG. 7 described above is equivalent to the addition of a flow passage for supplying a nitrogen gas to a pipe system shown in FIG. 7 of patent literature 1. Several modifications of the pipe system described in patent literature 1 are also applicable to this embodiment by adding a flow passage for supplying a nitrogen gas.

Further, in the case of using gas-phase carbon dioxide ($CO_2$) as the dry gas, each pipe system described in patent literature 1 can be used as it is. That is, by changing a control mode of opening and closing timings of valves using a pipe system similar to these, effects similar to those of this embodiment are obtained. Specifically, by providing a period for opening only the flow passage for introducing the processing fluid to the space below the support tray 15 after the support tray 15 is accommodated, the liquid on the lower surface of the substrate S can be swept away, using a gas flow created by the introduced pressurized gas.

In the piping system 200 in the above-described case, the passage routes for the processing fluid in respective states including a gas phase, a liquid phase, and a supercritical phase are separated from each other and the route shared among these states is minimized. This makes it possible to set the temperatures of the processing fluid in the respective states individually and to optimize these temperatures individually in response to purpose of the process. Thus, the supercritical drying process can be performed under an optimum condition to allow the substrate S to be dried favorably. Furthermore, eliminating the need to change the temperature of the fluid in response to the progress of the process acts advantageously in terms of the throughput of the process.

Note that the invention is not limited to the above embodiment and various changes other than the aforementioned ones can be made without departing from the gist of the invention. For example, in the above-described embodiment, carbon dioxide is used as a processing fluid for the supercritical process and IPA is used as a liquid for forming a liquid film. However, these are shown merely as examples and chemical substances to be used are not limited to these.

Further, the support tray 15 of the above-described embodiment includes the built-in heater and includes the through hole 152 for causing the lift pin 37 to pass therethrough. However, even if at least one of these members is not provided, it is still possible to achieve operation and effect comparable to those of the above-described embodiment. For this reason, a lift pin is not always required as an intermediary of transfer of a substrate to and from outside. As an example, the external transport device may be configured to place the substrate directly on the support tray. In this case, the transfer unit 30 is omissible. However, to prevent liquid pooling by the liquid dropped from the substrate S on the support tray 15, more specifically, on the recess 153, it is desirable that a through hole for causing the liquid to fall downward, a notch at the periphery of the recess 153 or the like is provided.

Further, for example, in the dry gas supply processing of the above embodiment, out of the pipe system connected to the processing chamber 12, only the flow passage for supplying the dry gas to the space below the support tray 15 is opened and the other introduction flow passage and discharge flow passage are closed. Instead of this, a valve 263 of FIG. 7 equivalent to the valve 175 of FIG. 6 may be also opened and the discharge of the liquid pushed out from the gap between the substrate S and the support tray 15 to outside may be promoted.

As the specific embodiment has been illustrated and described above, a nitrogen gas or carbon dioxide can be used as a gas in the substrate processing method according to the invention. High-purity nitrogen having a little content of oxygen and moisture can be used, and is suitable as a gas for such a use since high-purity nitrogen itself exerts little adverse effect on substrates. On the other hand, carbon dioxide is a substance having a low critical point and usable as a supercritical processing fluid. Therefore, the invention can be carried out without adding an apparatus configuration for introducing another gas.

Further, these gases may be introduced in a pre-heated state into an internal space. The gas of the invention to be supplied for the purpose of pushing out the liquid adhering to the lower surface of the substrate by forming a gas flow needs not have a heat quantity to vaporize the liquid. On the other hand, a temperature drop in the chamber due to a gas flow reduces the stability of the subsequent processing by the supercritical processing fluid. Thus, the introduction of the pre-heated gas contributes to temperature stabilization in the chamber.

Further, this invention may be configured that a pressure difference between an upper space of the support tray and a lower space of the support tray within the processing space is created by introducing the gas such that the lower space has a higher pressure than the upper space. According to this configuration, the liquid adhered to the lower surface of the substrate is swept away by a gas flow with a fast flow velocity generated by the pressure difference and pushed out from a gap between the substrate and the support tray.

Further, in this invention, through holes in the up-down direction may be provided in a part of the support tray where the substrate is placed. These through holes may be for allowing the passage of the lift pins for placing the substrate on the support tray. According to this configuration, since the pressurized gas introduced to the space below the support tray reaches the lower surface of the substrate through the through holes, the liquid removal effect on the substrate lower surface side can be enhanced.

For example, a recess having a plane size larger than that of the substrate and configured to accommodate the substrate may be provided in the upper surface of the support tray, and the through holes may be provided inside the recess. In this case, since the through holes are positioned right below the placed substrate, the pressurized gas can be effectively fed to the substrate lower surface.

The present invention is applicable to every type of substrate processing apparatus that processes a substrate using a supercritical fluid. In particular, the present invention is preferably applicable to a substrate drying process of drying a substrate such as a semiconductor substrate with a supercritical fluid.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing method, comprising:
supporting a substrate having a liquid film on an upper surface substantially in a horizontal posture by placing the substrate on a flat support tray;
accommodating the support tray into an internal space of a chamber and sealing the internal space;
introducing a gas which is pressurized toward a gap space between a lower surface of the support tray and a bottom surface of the internal space; and
processing the substrate by a supercritical processing fluid by introducing the supercritical processing fluid into the internal space, wherein a pressure difference between an upper space of the support tray and a lower space of the support tray within the processing space is created by introducing the gas such that the lower space has a higher pressure than the upper space.

2. The substrate processing method according to claim 1, wherein the gas is a nitrogen gas.

3. The substrate processing method according to claim 1, wherein the supercritical processing fluid is carbon dioxide.

4. The substrate processing method according to claim 1, wherein a through hole in an up-down direction is provided in a part of the support tray where the substrate is placed.

5. The substrate processing method according to claim 2, wherein the nitrogen gas in a heated state is introduced into the internal space.

6. The substrate processing method according to claim 3, wherein the gas is a carbon dioxide gas.

7. The substrate processing method according to claim 4, wherein the through hole for passing through a lift pin is provided in the support tray and the substrate is placed on the support tray by the lift pin.

8. The substrate processing method according to claim 7, wherein a recess that when viewed from above has a size larger than a size of the substrate and configured to accommodate the substrate is provided in an upper surface of the support tray and the through hole is provided inside the recess.

* * * * *